(12) United States Patent
Zabinski

(10) Patent No.: US 8,108,710 B2
(45) Date of Patent: Jan. 31, 2012

(54) DIFFERENTIAL COMMUNICATION LINK WITH SKEW COMPENSATION CIRCUIT

(75) Inventor: Patrick J. Zabinski, Stewartville, MN (US)

(73) Assignee: Mayo Foundation for Medical Education and Research, Rochester, MN (US)

( * ) Notice: Subject to any disclaimer, the term of this patent is extended or adjusted under 35 U.S.C. 154(b) by 591 days.

(21) Appl. No.: 12/350,750

(22) Filed: Jan. 8, 2009

(65) Prior Publication Data

US 2009/0174448 A1      Jul. 9, 2009

Related U.S. Application Data

(60) Provisional application No. 61/019,716, filed on Jan. 8, 2008.

(51) Int. Cl.
*G06F 1/04* (2006.01)

(52) U.S. Cl. .................. 713/503; 713/500; 327/161

(58) Field of Classification Search .............. 713/500, 713/503; 327/161
See application file for complete search history.

(56) References Cited

U.S. PATENT DOCUMENTS

| | | | |
|---|---|---|---|
| 6,335,647 B1 * | 1/2002 | Nagano | 327/161 |
| 6,353,340 B1 | 3/2002 | Satoh | |
| 6,374,361 B1 | 4/2002 | Lee et al. | |
| 6,909,980 B2 | 6/2005 | Fernando | |
| 6,937,681 B2 | 8/2005 | Watanabe | |
| 7,408,425 B2 * | 8/2008 | Zabinski et al. | 333/33 |
| 7,538,594 B2 * | 5/2009 | Jia et al. | 327/261 |
| 2004/0064765 A1 | 4/2004 | Panis | |
| 2004/0181764 A1 | 9/2004 | Brist et al. | |
| 2004/0262036 A1 | 12/2004 | Brist et al. | |
| 2005/0099216 A1 * | 5/2005 | Dyer et al. | 327/165 |
| 2006/0123371 A1 | 6/2006 | Brist et al. | |
| 2006/0244505 A1 * | 11/2006 | Fung et al. | 327/293 |
| 2006/0256880 A1 * | 11/2006 | Frisch | 375/257 |
| 2007/0121734 A1 * | 5/2007 | Jia et al. | 375/244 |
| 2007/0223205 A1 | 9/2007 | Liang et al. | |
| 2009/0153213 A1 * | 6/2009 | Jia et al. | 327/261 |

OTHER PUBLICATIONS

Heck. H, S. Hall, B. Horine, K. Mallory, and T. Wig., Impact of FR4 Dielectric Non-Uniformity on the Performance of Multi-Gb/s Differential Signals in IEEE Electrical Performance of Electronic Packaging, 2003, Princeton, NJ: IEEE.

Heck, H., S. Hall, B. Horine, and T. Liang., Modeling and Mitigating AC Common Mode Conversion in Multi-Gb/s Differential Printed Circuit Boards in IEEE Electrical Performance of Electronic Packaging, 2004, Portland, OR: IEEE.

McMorrow, S., and C. Heard, The Impact of PCB Laminate Weave on the Electrical Performance of Differential Signaling at Multi-Gigabit Data Rates, in DesignCon, 2005, Santa Clara, CA.

Bogatin, E., Skewering Skew, in Printed Circuit Design & Manufacture, 2005, p. 48.

Ritchey, L., On the Problem of Jitter and Skew in Gigabit and Faster Signals Caused by Laminate Weaves, 2007, Speeding Edge, Inc. p. 1-2.

\* cited by examiner

*Primary Examiner* — Nitin Patel

(74) *Attorney, Agent, or Firm* — Quarles & Brady LLp

(57) ABSTRACT

A system and method is presented for reducing skew between the positive and negative components of a differential signal in a high speed communications link. The communications link includes a signal generator producing and transmitting complementary positive and negative signals over separate transmission lines and a receiver receiving the complementary signals. The communication link further includes a skew compensation circuit having a skew detector, a controller, and separate delay and buffer elements for both the positive and negative component of the differential signal. The controller separately controls each of the delay or buffer elements in response to the detected skew between differential signal components.

10 Claims, 4 Drawing Sheets

DIFFERENTIAL COMMUNICATION LINK WITH SKEW COMPENSATION CIRCUIT

CROSS-REFERENCE TO RELATED APPLICATIONS

This application is based on U.S. Provisional Patent Application Ser. No. 61/019,716, filed on Jan. 8, 2008, and entitled "DIFFERENTIAL SKEW-COMPENSATION CIRCUIT", the contents of which are fully incorporated herein by reference.

STATEMENT REGARDING FEDERALLY SPONSORED RESEARCH

Not applicable.

BACKGROUND

1. Field of the Invention

The invention relates generally to skew correcting circuits for differential signals and, in particular, to circuits for high-speed differential communication links that can measure and adaptively compensate for differential signal skew.

2. Description of Related Art

Today's high-speed communication systems often rely on differential signal protocols to enhance noise immunity, reduce transient currents, and increase effective signal amplitude. As depicted in FIG. 1, a conventional differential communication link 10 includes a transmit end 12 having a transmitter 14, a receive end 16 having a receiver 18, and a pair of transmission lines 20A, B extending therebetween. Both the transmitter 14 and receiver 18 utilize differential signal generation and transmission protocols known in the art.

An illustrated differential signal 19 is comprised of two complementary intra-pair signal components, referred to herein as the P-side signal 21A and the N-side signal 21B. The P-side signal 21A is also known as the positive, true, or non-inverted signal, or component, of the differential signal while the N-side signal 21B is also known as the negative, complement, or inverted signal, or component. Each signal 21A, B includes an AC portion, or signal pulse, 22A, B, having a fixed width.

To effectively transmit and reconstruct the differential signal 19, the signal polarity of the P-side and N-side signals 21A, B must be mirrored copies of one another and the relative timing of the two sides must be identical, or in phase. As is known to those in the art, several design, material, manufacturing, and circuit anomalies can unpredictably and/or undesirably alter the relative intra-signal/inter-side phase relationship between the P-side and N-side signals 21A, B as they propagate through the transmission lines 20A, B. This typically results in a sub-optimal signal relationship between the P-side and N-side 26A, B of the received differential signal 25. As measured with a standard eye diagram (widely used for qualitatively analyzing digital transmission signals), these anomalies reduce the effective eye opening in both the voltage and timing margins at the receive end 16 of the high speed communication link 10. This performance-degrading phenomenon is referred to as differential signal skew.

Recent studies have demonstrated differential signal skew to be significant in printed circuit board (PCB) environments due to what is referred to as the weave effect. Substrates for printed circuit boards are often constructed with a glass weave to provide mechanical reinforcement. Because the dielectric constant of glass is typically higher, or at least different, than the surrounding resin, differential traces routed over such a glass weave structure typically exhibit a measurable amount of trace-to-trace variations in characteristic impedance and propagation delay, thus causing differential signal skew.

To compensate for weave effect, a number of design methods for routing traces to reduce the impact on differential signal skew have been presented. Examples include methods taught by U.S. Pat. App. Pub. Nos. 2004/0262036—Printed Circuit Board Trace Routing Method, 2004/0181764—Conductor Trace Design to Reduce Common Mode Cross-Talk and Timing Skew, and 2007/0223205—Shifted Segment Layout for Differential Signal Traces to Mitigate Bundle Weave Effect. These methods are specific to the passive interconnect within the circuit board substrate and therefore are believed to be effective in reducing the amount of differential signal skew specifically attributable to laminate-related weave effects.

Currently, no known computer-based circuit board design tools employ these design methods to prevent differential signal skew caused by the weave effect. Thus, these methods must be manually implemented by a knowledgeable and skilled board designer. Several of these design methods, such as non-orthogonal and disjoint routing techniques, are likely to require additional routing space, increasing the size, complexity, and cost of the circuit board. Even after these methods become automated and common in high speed communication circuit boards, differential signal skew is also caused by other mechanisms including, for example, imbalanced trace routing, vias, connectors, return paths, and active circuitry. Using these methods to minimize differential signal skew caused by the weave effect does not alleviate the skew-causing effects of these other mechanisms, and therefore are necessarily limited in application and value.

Another known design method related to skew compensation of single-ended and differential signals include U.S. Pat. No. 6,335,647—Skew Adjusting Circuit, U.S. Pat. No. 6,937,681, Skew Correction Apparatus, and U.S. Pat. No. 6,374,361—Skew-Insensitive Low Voltage Differential Receiver. The design methods taught by these references include adjusting the delay of a data or clock signal relative to a distinctly different signal such as a reference clock or other data signals in parallel busses. Such methods improve the timing of sampling circuits at the receiving end of a differential signal link by adjusting the skew of the signal in its entirety. These methods do nothing to improve the integrity, enhance the value, or actually adjust the differential signal skew of the P and N sides within differential signals themselves. Accordingly, these references do not provide a method of adaptively compensating for differential signal skew.

Still other design methods, believed to be suitable for their intended purposes, do not provide adequate correction of differential signal skew. For example one design method taught by U.S. Pat. App. Pub. No. 2006/0256880—Automatic Skew Correction for Differential Circuits monitors the P and N sides of a transmitted differential signal reflected back to the transmitter and correspondingly adjusting the relative timing of the transmitter's P and N outputs. Due to losses in PCB interconnect products (i.e., up to 30 dB for a one-way loss and up to 60 dB [1000:1 voltage reduction] for a round-trip loss), the reflected signal strength can be drastically reduced, thus severely impacting the effectiveness of the internal feedback loop. In low-loss environments where the reflected signal strength can be appreciable, this method assumes that the reflected signals are generated solely at the receiving end of the communication link. However, intermediate structures such as solder balls, connectors, and vias, present larger reflected signals back to the transmitter, thus further reducing the effectiveness of this method.

Other methods disclosed in U.S. Pat. No. 6,909,980—Auto Skew Alignment of High-Speed Differential Eye Diagrams and U.S. Pat. App. Pub. No. 2004/0064765—Differential Detector Employing Analog-to-Digital Converter compensate for signal skew in the receiver. However, each of these methods sample the P and N sides independently using analog-to-digital (A/D) converters, thus eliminating the benefits of using differential signals. In addition, these methods compensate for differential signal skew by delaying internal digital samples, either by shifting the digital samples within the processor or by adjusting the time points where the signals are sampled. As such, these methods do nothing to enhance the actual differential signal at the input to the receiver, but simply improve the displayed waveforms.

A yet further method for adjusting skew in a differential signal is taught by U.S. Pat. No. 6,353,340—Input and Output Circuit With Reduced Skew Between Differential Signals. In several disclosed embodiments, when the individual input P and N sides have opposite polarity, the output P and N sides are allowed to toggle. However, when the differential signal skew is sufficient enough that the input P and N sides have the same polarity, the P and N output sides are held at a steady state or high-impedance state until the trailing side toggles states. Another disclosed embodiment discloses the use of delay lines; however, the delay is again determined by the logic state of the individual P and N sides. In all the disclosed embodiments, the differential signal skew adjustment is determined by the logic state of the individual P and N sides of the input signal and not by the difference between the P and N sides. As such, the benefits of differential signal protocols are lost. Also, the differential signal skew compensation is adjusted instantaneously for each and every signal transition, which can severely impact jitter and duty cycle distortion; thus, degrading the resulting differential signal.

A still further method taught by U.S. Pat. App. Pub. No. 2006/0244505—Intra-Pair Differential Skew Compensation Method and Apparatus for High-Speed Cable Data Transmission Systems, attempts to overcome the issues aforementioned associated with the method of U.S. Pat. No. 6,353,340. This method requires an initial training sequence wherein the differential signal skew compensation is adjusted once and, thereafter, the compensation is fixed. Such a method is only valuable to compensate for static causes of differential signal skew such as the PCB weave effect. However, this method cannot compensate for dynamic causes such as power droop or intersymbol interference. Also, using training patterns is not always feasible in communication links, and the compensation adjustments are dependent on the data pattern. Because any training pattern will have different characteristics than actual data streams, compensating based on a training pattern produces sub-optimal results.

A method taught by U.S. Pat. No. 7,085,337—Adaptive Per-Pair Skew Compensation Method for Extended Reach Differential Transmission, continuously adjusts differential signal skew compensation at the receiver. However, as with a method above, the P and N sides are treated as two different entities, instead of as a single lumped differential signal. As described above, this negates the benefits of using differential signals. Also, this method uses a slicer (i.e., an A/D converter) to digitize a version of the incoming data signal, then reconverts the digital data back into an analog waveform to compare the original and reconstructed analog signals and use the difference between these two signals to control the delay block. To be effective, the reconstructed signal needs to be converted to a digital format and then back to the analog domain within a fraction of the signal's edge rate, which severely limits the maximum data rate with which the method can be used. In addition, the described "delay block" does not directly adjust the delay of the incoming analog signal, but instead performs a complex filtering function on the individual P and N sides of the differential signal, which again reduces the benefits of using differential signals.

Therefore, to ensure reliable performance of high-speed differential communication links, what is needed is a circuit and method for compensating for differential-skew that directly considers the received differential signal (i.e., not the P and N sides individually), does not place additional burden on the PCB design/designer, compensates for static and dynamic changes in differential signal skew, and compensates skew caused by many sources.

SUMMARY

The present invention provides an active circuit that adaptively compensates for differential signal skew at the receiving end of a high-speed communication link.

In accordance with one aspect of the present invention, a high speed differential communication link includes a transmitter generating a differential signal having a positive and a complementary negative component. The positive and negative components of the differential signal are transmitted over separate sides of a differential pair of transmission lines. A skew compensation circuit is provided that measures the skew between the positive and negative components of the differential signal and adaptively compensates for the skew. A receiver is included to receive the differential signal.

Additionally, the skew compensation circuit includes a skew detector that determines the skew between the positive and negative components of the differential signal. Each of the positive and negative components of the differential signal is transmitted through a respective delay or buffer element. A controller receives the determined skew from the skew detector as an input and sends an output signal to each of the plurality of delay or buffer elements in response to the differential signal skew input.

Furthermore, the high speed communications link further includes a terminator configured to reduce signal reflections on the transmission lines. The skew compensation circuit may be located between the terminator and the receiver or between the transmission lines and the terminator.

In accordance with another aspect of the present invention, a method of minimizing skew in a high speed communication link includes terminating a differential signal having complementary positive and negative components received from a pair of transmission lines to reduce signal reflections, directing the terminated differential signal to a skew compensation circuit calculating a relative skew between the positive and negative components of the differential signal, directing a signal representative of the calculated skew to a controller, and generating output signals for at least one of the positive and negative components of the differential signal to minimize the relative skew therebetween.

Various other features of the present invention will be made apparent from the following detailed description and the drawings.

DETAILED DESCRIPTION

Figure 1:
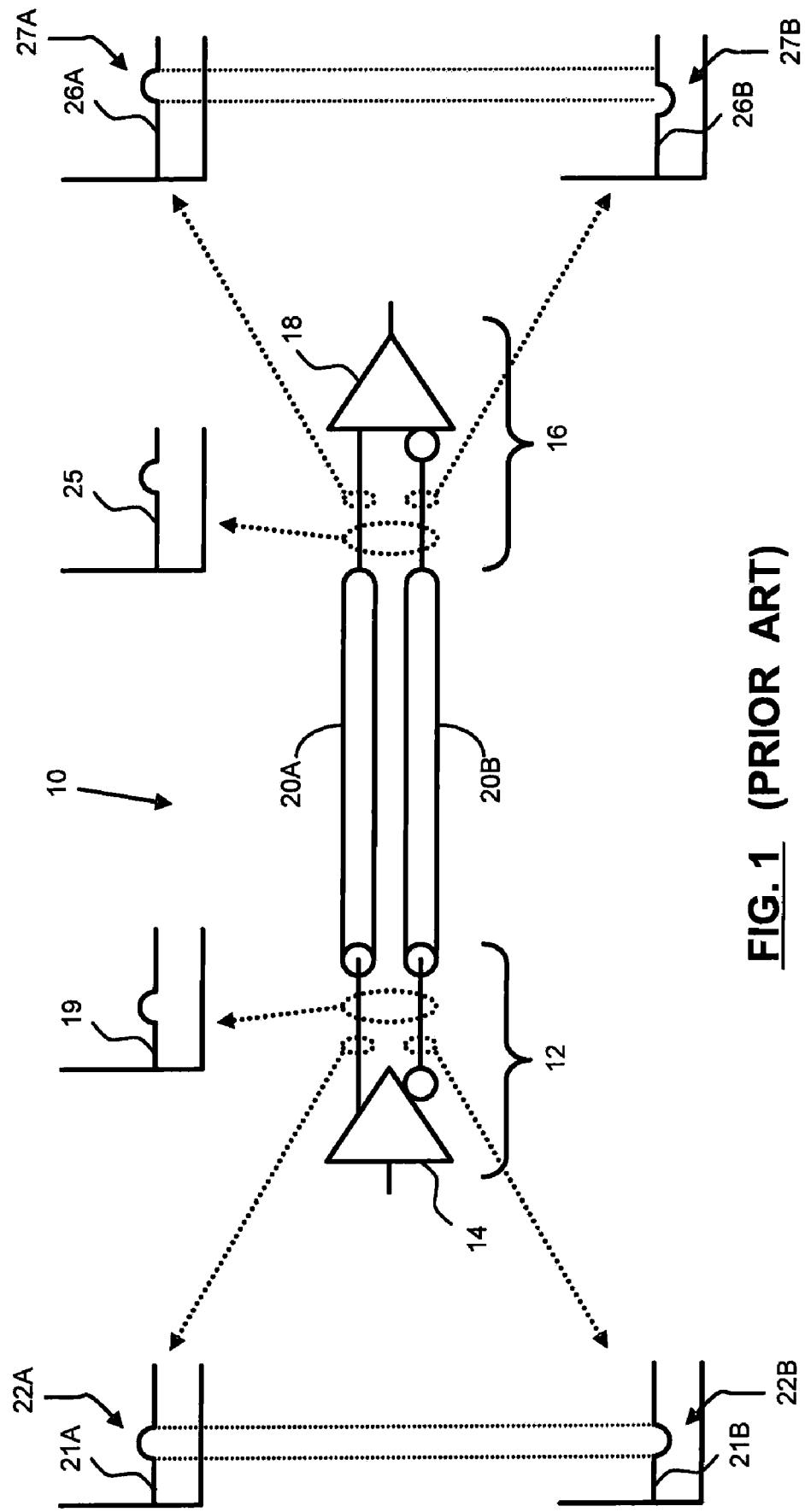
FIG. 1, already described, is a schematic representation of a conventional high-speed differential communications link.
Figure 2:
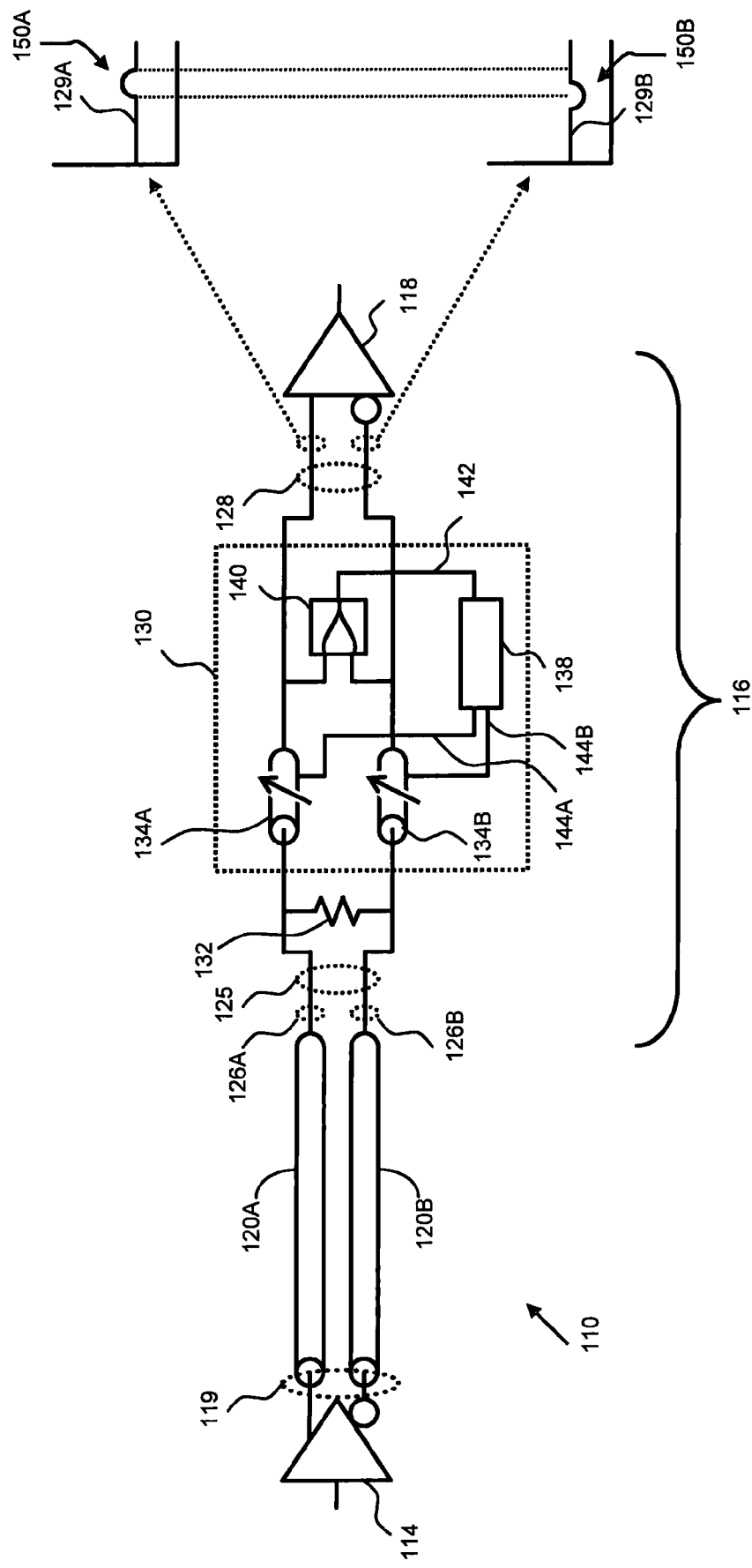
FIG. 2 is a schematic representation of a first embodiment of a high-speed differential communication link with a skew compensation circuit in accordance with the present invention.

A high-speed differential signal communication link 110 according to a first embodiment of the present invention is shown in FIG. 2. The communication link 110 includes a skew compensation circuit 130 disposed between a terminator 132 and a conventional differential signal receiver 118. A differential signal 119 generated by a conventional transmitter 114 is broadcast over a pair of differential transmission lines 120A, B in accordance with known systems and methods. The transmission lines 120A, B are terminated at the terminator 132 disposed in the receive end 116 of the link 110 to reduce signal reflections. Terminator 132 is shown as a single resistive element in FIG. 2, but those skilled in the art will recognize that transmission-line terminators can take many forms. The use of the term "terminator" is used herein to represent a circuit applied to the receive end 116 of a communication link 110 to provide optimal impedance match for minimizing signal reflections and/or optimizing the effective signal amplitude.

The terminated differential signal 125 is fed into a skew-compensation circuit 130 configured to detect and reduce skew between the P-side and N-side signal 126A, B of the received differential signal 125 as explained below. The skew-compensation circuit 130 outputs skew-corrected P-side and N-side signals 129A, B with little to no relative skew between them. The corrected signals 129A, B are subsequently fed into the differential receiver 118 at the receive end 116 of the link 110.

As illustrated, the skew-compensation circuit 130 receives the P-side and N-side signals 126A, B as inputs to respective delay elements 134A, B. The delay elements 134A, B are controlled by a controller 138 to adjust the relative skew between the two signals 126A, B. The delay elements 134A, B output the skew-corrected P-side and N-side signals 129A, B which are subsequently received by both a skew detector 140 and the differential receiver 118 as inputs. When properly de-skewed by the skew-compensation circuit 130, the P-side and N-side signals 129A, B are phase aligned such that the receiver 118 can readily discern the intended differential signal 128.

The skew detector 140 monitors the skew-corrected P-side and N-side signals 129A, B and quantifies the amount of relative skew between them. One method of quantifying the relative skew is by adding the AC components 150A, B of the two signals 129A, B together. When the two signals 129A, B have no measurable skew between them, the sum of the AC components 150A, B is zero. With this method of quantifying skew, the optimal output of the skew detector 140 is a zero-amplitude control signal.

Another method for quantifying the relative skew between the P-side and N-sides 129A, B is to subtract the respective AC components 150A, B. When the difference between the signals 129A, B is maximized, there is no skew in the differential signal 128. With this method, the optimal output of the skew detector 140 is a signal with a relatively high AC voltage (or current) amplitude. Those skilled in the art will recognize that both the subtraction and addition methods are viable, and the selection of either method is dependent on the needs of the system application.

The output of the skew detector 140 is fed into the aforementioned controller 138 via a signal line 142. The controller 138 interprets the output signal from the skew detector 140, filters the output to provide the desire frequency response and stability, generates appropriate control signals, and directs the control signals to the delay elements 134A, B via control lines 144A, B, respectively, thus forming a closed feedback control loop.

In analog form, the controller 138 is a low-pass filter comprised of discrete inductors, capacitors, and resistors, which effectively time-averages the output of the skew detector 140 and provides a stable signal to delay elements 134A, B. In digital form, the controller 138 consists of an analog-to-digital converter (ADC) and performs filtering using digital signal processing (DSP) algorithms that are well known in the art to generate the control signals to delay elements 134A, B. Those skilled in the art will recognize that both analog and digital methods are viable, and the selection of either method is dependent on the needs of the system application.

The skew compensation circuit 130 compensates for the differential signal skew caused by all of the sources upstream from the receiver 118. The feedback provided by the skew detector 140 enables the skew compensation circuit 130 to dynamically adapt to changes in the differential signal skew. Although not illustrated, filter components may be utilized within the controller 138 to control the response time of the feedback loop, and to help ensure stability.

Figure 3:
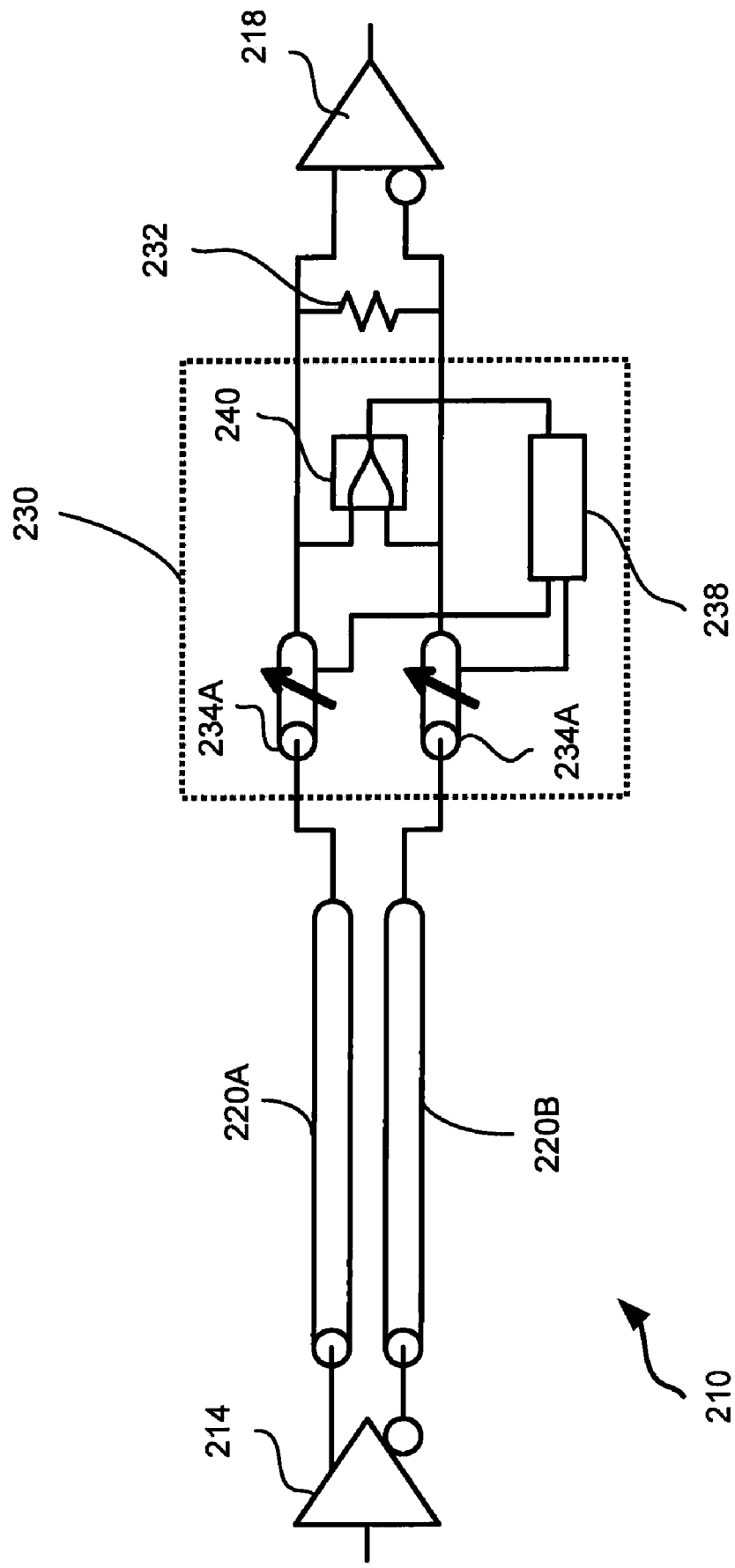
FIG. 3 is a schematic representation of a second embodiment of a differential communication link with the skew compensation circuit of FIG. 2 in accordance with the present invention.

Turning now to FIG. 3, a high-speed differential signal communication link 210 according to a second embodiment of the present invention is shown. The link 210 includes a skew compensation circuit 230 disposed between differential transmission lines 220A, B and a terminator 232. The configuration and operation of the skew compensation circuit 230 is similar to the circuit 130 of FIG. 2. The comparator skew detector 240, controller 238, and the delay elements 234A, B all operate in the same manner. However, the skew compensation circuit 230 is disposed upstream from a terminator 232 such that the effective input differential-impedance match into the skew compensation circuit 230 is enhanced by ensuring the received P-side and N-side signals 229A, B arrive simultaneously at the terminator, further improving the integrity of the differential signals 225.

Figure 4:
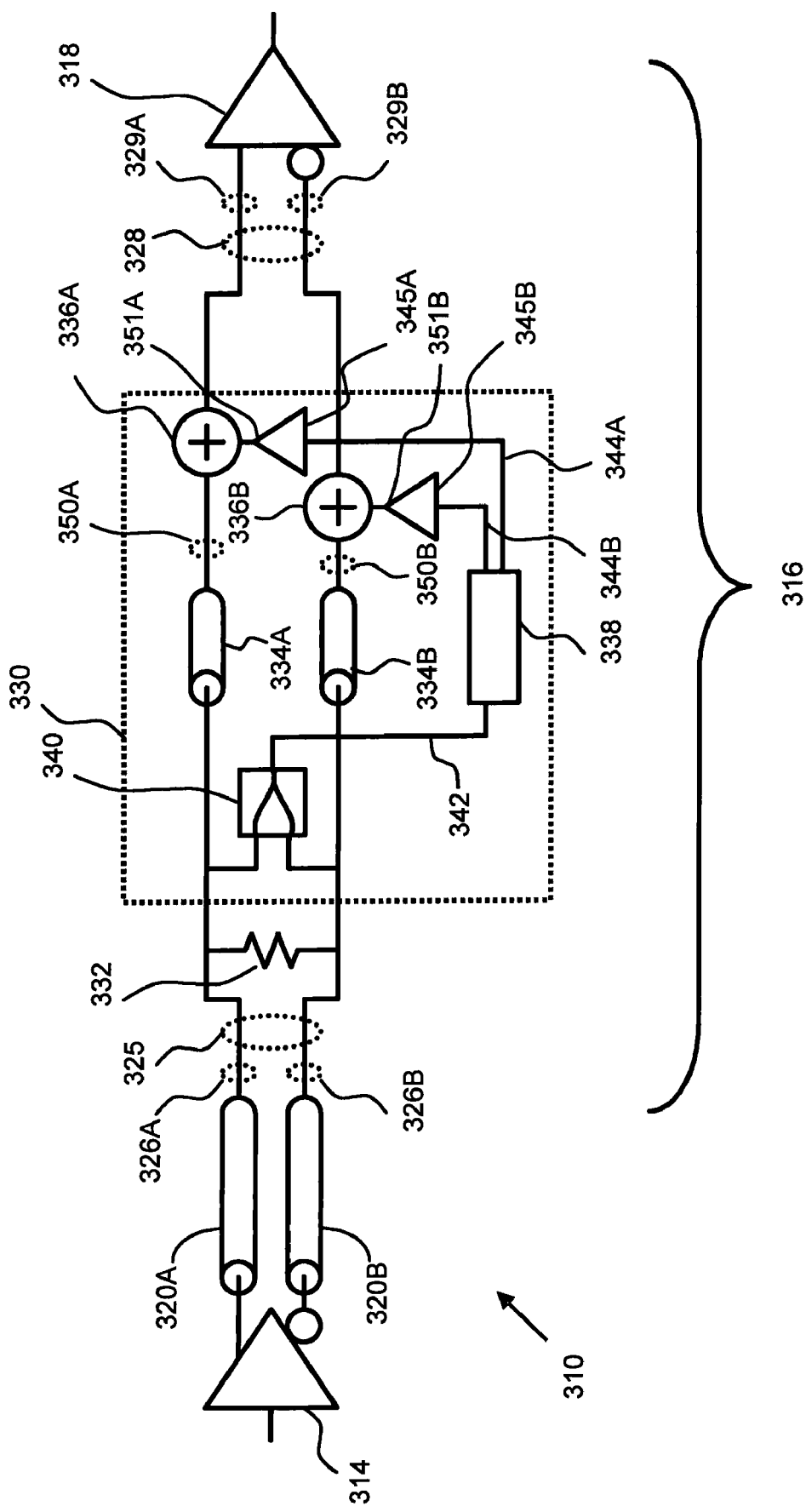
FIG. 4 is a schematic representation of a third embodiment of a differential communication link with another skew compensation circuit in accordance with the present invention.

Turning now to FIG. 4, a high-speed differential signal communication link 310 according to a third embodiment of the present invention is shown. Like the high speed communication link 110 of FIG. 2, a skew compensation circuit 330 is disposed between a terminator 332 and a differential signal receiver 318. Unlike the links 110, 210 of FIGS. 2 and 3, no variable-delay elements are used in the skew compensation circuit 330 to compensate for skew in the differential signal.

As illustrated, the differential transmission lines 320A, B are terminated at the terminator 332 directed into the skew-compensation circuit 330. The circuit 330 is configured to detect and reduce relative skew occurring between the P-side and N-side signals 329A, B of the differential signal 328 that are subsequently fed into the differential receiver 318 at the receive end 316 of the link 310.

The skew detector 340 monitors the P-side and N-side signals 326A, B of the received differential signal 325 and quantifies the differential signal skew between them in a manner such as previously described. The signals 326A, B are delayed through fixed-delay elements 334A, B, described below. The outputs of the fixed-delay elements 334A, B are delayed P-side and N-side signals 350A, B.

The skew detector 340 outputs a signal to a controller 338 via a signal line 342. The controller 338 produces and outputs corresponding control signals via signal lines 344A, B to buffers 345A, B. The delayed P-side and N-side signals 350A, B and buffered P-side and N-side signals 351A, B are fed into adders 336A, B where the signals are added together to produce de-skewed P-side and N-side signals 329A, B of the skew-corrected differential signal 328.

Still referring to FIG. 4, in one method for skew compensation, the buffers 345A, B produce P-side and N-side compensation signals 351A, B that are of appropriate shape, polarity, and amplitude that when added to the delayed P-side and N-side signals 329A, B, the resulting differential signal 328 is presented to the receiver 318 with minimal, if any, relative skew.

One method of producing the control signals 351A, B to correct for skew between the received P-side and N-side signals 326A, B involves the controller 338 producing a signal that is expressed mathematically as P+N where the P-side and N-side signals 326A, B are added together. The controller 338 and buffers 345A, B then fraction this summation back to the differential input, where the P-side signal 326A has (P+N)/2 added to it, and the N-side signal 326B has (P+N)/2 subtracted from it. By injecting these fractional summations back into the input, the effective signal at the input to the receiver 318 is [P+(P+N)/2]−[N−(P+N)/2]=1.5P+0.5P+0.5N−0.5N=2P. In an ideal differential signal 325, i.e., the N-side signal 326B has the opposite polarity but is otherwise identical to the P-side signal 326A, i.e., N=−P. The ideal received differential signal 325 is P−N=P−(−P)=2P, which is the same effective signal presented to the receiver 318 in this embodiment of a high speed communication link 310.

In addition to providing a de-skewed differential signal 328 to the receiver 318, the skew compensation circuit 330 illustrated in FIG. 4 also compensates for the differential reflected signal at the terminator 332, thus presenting the transmitter 314 with an effective ideal termination, which significantly aids in improving the resulting signal quality as measured with an eye diagram.

One design constraint with the skew compensation circuit 330 is the delay time of the feedback control loop through controller 338 and buffers 345A, B. To be effective, the buffered P-side and N-side compensation signals 351A, B should be injected into the adders 336A, B within the transition period of the signal (e.g., rising or falling edge) of the delayed signals 350A, B. By inserting fixed-delay elements 334A, B into the signal path, the signals 326A, B can be delayed an amount corresponding to the delay through the controller 338 and buffers 345A, B. As such, the outputs of buffers 345A, B are added to the delayed signals 350A, B.

In practice, the buffers 345A, B and adders 336A,B can take many forms and can often be incorporated into controller 338. The primary purpose of buffers 345A, B is to isolate the signals 351A, B from being injected into the controller 338, and to produce signals that are of appropriate shape and amplitude. The purpose of the adders 336A, B is to add the delayed P-side and N-side signals 350A, B and the compensation signals 351A, B without affecting the respective driving circuitry.

According to one aspect of the present invention, to ensure stability and minimize jitter effects, the dynamic response of the compensation may be controlled with respect to both amplitude and response time. Furthermore, and according to another aspect of the present invention, in an effort to obtain optimum compensation, the differential signal skew is monitored at the receiving end of the high-speed communication link rather than at the transmitting end as is done in the prior art. According to yet another aspect of the present invention and to maintain and enhance the benefits of differential signal protocols, the final logic-level detection circuit (a.k.a., receiver, sampler, or slicer) considers the difference between the P and N sides of the differential signal rather than the two sides independently.

Accordingly, a system and method are provided that compensate for both static and dynamic differential-skew to ensure stability through filtering of the feedback loop, ensure peak performance by monitoring the differential signal at the receiving end of the communication link rather than at the transmitting end, and compensate for differential termination.

The present invention has been described in terms of the various embodiments, and it should be appreciated that many equivalents, alternatives, variations, and modifications, aside from those expressly stated, are possible and within the scope of the invention. Therefore, the invention should not be limited to any particular described embodiment.

The invention claimed is:

1. A high speed communication link comprising:
   a transmitter generating a differential signal having a positive and a complementary negative component;
   a pair of transmission lines wherein each of the positive and negative components of the differential signal are transmitted over a respective one of the pair of transmission lines;
   a terminator for reducing reflections of the differential signal;
   a skew compensation circuit receiving the differential signal, the circuit including:
   a skew detector for determining the skew between the positive and negative components of the differential signal;
   a plurality of delay elements, wherein each of the positive and negative component of the differential signal are transmitted through a respective delay element; and
   a controller, wherein upon receiving an input signal from the skew detector, generates an output compensation signal for each of the positive and negative components of the differential signal;
   wherein the skew compensation circuit is disposed between the terminator and the receiver, and measures skew between the positive and negative components of the differential signal and adaptively compensates for the skew; and
   a receiver receiving the differential signal.

2. The high speed communications link of claim 1, wherein the controller is operatively connected to the delay elements, wherein the compensation signal for each of the positive and negative components of the differential signal is a time delay signal.

3. The high speed communication link of claim 1, wherein the skew compensation circuit is disposed between the pair of transmission lines and the terminator.

4. The high speed communications link of claim 1, wherein the skew compensation circuit is further comprised of a plurality of buffer elements, wherein the controller is operatively connected to the buffer elements, wherein the compensation signal for each of the positive and negative components is injected into the respective transmission line by at least one of the plurality of buffer elements.

5. A high speed differential communication link comprising:

a transmitter generating a differential signal having a positive and a complementary negative component;

a pair of transmission lines wherein each of the positive and negative components of the differential signal are transmitted over a unique transmission line;

a terminator for reducing reflections of the differential signal;

a skew compensation circuit for measuring and compensating for skew between the positive and negative components of the differential signal, the circuit including:
  a skew detector;
  a controller having an input operatively connected to the skew detector and an output operatively connected to signal buffers;
  a plurality of delay elements;
  a plurality of signal buffers that produce compensating signal waveforms; and
  a plurality of adders, each adder having a first input operatively connected to one of the plurality of delay elements and a second input operatively connected to one of the plurality of the signal buffers, each adder producing an output signal representative of the addition of the first and second inputs; and a receiver receiving the differential signal from the skew-compensation circuit; and wherein the skew compensation circuit is disposed between the terminator and the receiver.

6. A method of minimizing skew in a high speed communication link, the method comprising:

terminating a differential signal having complementary positive and negative components received from a pair of transmission lines to reduce signal reflections;

directing the terminated differential signal to a skew compensation circuit;

calculating a relative skew between the positive and negative components of the differential signal;

directing a signal representative of the calculated relative skew to a controller; and with the use of the skew compensation circuit, output signals for at least one of the positive and negative components of the differential signal to minimize the relative skew therebetween.

7. The method of claim 6, wherein calculating the relative skew between the positive and negative components is accomplished by summing an AC portion of the positive component and an AC portion of the negative components together and comparing the summed AC portions to zero.

8. The method of claim 6, wherein calculating the relative skew between the positive and negative components is accomplished by subtracting an AC portion of the negative component from an AC portion of the positive component and comparing the subtracted value to a maximum signal value.

9. The method of claim 6, wherein the output signals are directed at least one delay element operatively connected to at least one of the positive and negative components of the differential signal.

10. The method of claim 6, wherein the output signals are directed to at least one buffer element operatively connected to at least one of the positive and negative components of the differential signal.

* * * * *